US006967530B2

(12) United States Patent

Omata et al.

(10) Patent No.: US 6,967,530 B2

(45) Date of Patent: Nov. 22, 2005

(54) CIRCUIT AND SEMICONDUCTOR DEVICE FOR REDUCING THE GENERATION OF SHOCK NOISE OF A POWER AMPLIFIER OUTPUTTING AMPLIFIED AUDIO SIGNALS

(75) Inventors: Jun-Ichi Omata, Atsugi (JP); Yuji Yamanaka, Atsugi (JP); Tomomi Oda, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 10/789,468

(22) Filed: Feb. 27, 2004

(65) Prior Publication Data

US 2004/0257154 A1 Dec. 23, 2004

(30) Foreign Application Priority Data

Jun. 20, 2003 (JP) ............................ 2003-176429

(51) Int. Cl.[7] ................................................ H03F 1/14

(52) U.S. Cl. ........................ 330/51; 330/104; 330/112; 330/250

(58) Field of Search .......................... 330/51, 250, 269, 330/271, 104, 112, 255, 263

(56) References Cited

U.S. PATENT DOCUMENTS 4,383,223 A * 5/1983 Ulmer ........................ 330/253
4,471,321 A * 9/1984 Bowers ...................... 330/261
4,516,082 A 5/1985 Smith et al.
4,730,168 A * 3/1988 Senderowicz et al. ...... 330/253
4,881,045 A * 11/1989 Dillman ...................... 330/253
5,471,171 A * 11/1995 Itakura et al. ............. 330/253
5,656,947 A 8/1997 Opris
6,304,109 B1 10/2001 Brokaw

* cited by examiner

*Primary Examiner*—Lam T. Mai
(74) *Attorney, Agent, or Firm*—Ladas & Parry LLP

(57) ABSTRACT

A circuit for a power amplifier is disclosed which amplifies and outputs an audio signal by amplifying an input audio signal using first and second differential circuits, and driving a push-pull output transistor with the outputs from the first and second differential circuits. The circuit includes a signal generating part generating a disconnection timing signal for disconnecting a bias current reducing activation currents of the first and second differential circuits based on a switch control signal, and positive feedback loops of the first and second differential circuits. A switch part is disposed in each of the positive feedback loops of the first and second differential circuits, disconnecting the positive feedback loops in response to the disconnection timing signal. A bias part stops the operation of the first and second differential circuits by reducing the activation currents of the first and second differential circuits by reduction of the bias currents.

6 Claims, 5 Drawing Sheets

CIRCUIT AND SEMICONDUCTOR DEVICE FOR REDUCING THE GENERATION OF SHOCK NOISE OF A POWER AMPLIFIER OUTPUTTING AMPLIFIED AUDIO SIGNALS

BACKGROUND OF THE INVENTION

1. Field of the Invention

The present invention generally relates to a circuit and a semiconductor device, and more particularly to a circuit and a semiconductor device for reducing the generation of shock noise of a power amplifier outputting amplified audio signals.

2. Description of the Related Art

FIG. 4 is a block diagram showing an example of an audio power amplifier. In the diagram, audio signals which are output from a signal source 10 are supplied to power amplifiers 12, 14. Inverse switch signals S1, S2 from terminals 16, 18 are supplied to the power amplifiers 12, 14, respectively, in which either one of the power amplifiers 12, 14 operates in response to the respective switch signals S1, S2.

The power amplifier 12 is, for example, used for a headphone. The audio signals amplified with the power amplifier 12 are supplied to a headphone speaker 20, thereby allowing sound to be generated therefrom. The power amplifier 14 is, for example, used for a speaker. The audio signals amplified with the power amplifier 14 are supplied to a speaker 22, thereby allowing sound to be generated therefrom.

FIG. 5 is a diagram showing an example of an output stage of a conventional power amplifier. In the diagram, audio signals are input between terminal 30*a* and terminal 30*b* according to differential input. The gates of p channel FETs (Field Effect Transistor) M1, M2 are connected to the terminals 30*a*, 30*b*, respectively, thereby forming a differential circuit of the FETs M1, M2 together with n channel FETs M3, M4, and p channel FET M5.

A gate and a drain of p channel FET M6 are connected to a gate of FET M5, thereby forming a current mirror circuit. A drain of FET M6 is connected to a drain of n channel FET M7, and a gate of FET M7 is connected to a drain of FET M1. Accordingly, the output of the differential circuit of FETs M1, M2 is positively fed back to the differential circuit of FETs M1, M2 through a route of FETs M1, M7, M6, and M5.

The gates of p channel FETs M11, M12 are connected to the terminals 30*a*, 30*b*, respectively, thereby forming a differential circuit of FETs M11, M12 together with n channel FETs M13, M14, and p channel FET M15.

A gate and a drain of p channel FET M16 are connected to a gate of FET M15, thereby forming a current mirror circuit. The drain of FET M16 is connected to a drain of n channel FET M17, and a gate of FET M17 is connected to a drain of FET M12. Accordingly, the output of the differential circuit of FETs M11, M12 is positively fed back to the differential circuit of FETs M11, M12 through a route of FETs M12, M17, M16, and M15.

The output of the differential circuit of FETs M1, M2 is supplied from a drain of FET M11 to a gate of FET M19, and the output of the differential circuit of FETs M11, M12 is supplied from a drain of FET M17 to the gate of p channel FET M18. FET M18, M19 are connected with a common drain, the source of FET M18 is connected to electric source Vcc, the source of FET M19 is grounded, and an output terminal 32 is connected to the drain of FETs M18, M19, thereby allowing audio signals to be output from the output terminal 32.

The terminal 34 is supplied with a switch signal (S1 or S2). The terminal 34 is connected to a gate and a drain of p channel FET M20 and the gates of p channel FETs M21, M22, thereby forming a current mirror circuit of FETs M20, M21, and M22. A source of FET M20 is connected to a current generator 36. A drain of FET M21 is connected to a drain of p channel FET M24, and the drain and a gate of FET M24 are connected to the gate of FET M17, thereby forming a current mirror circuit. It is to be noted that the drain of FET M17 is connected to the drain and gate of FET M16 and the gate of FET M18, thereby forming a current mirror circuit. Furthermore, a drain of FET M22 is connected to a drain of p channel FET M25, and the drain and a gate of FET M25 are connected to the gates of FET M7 and M19, thereby forming a current mirror circuit.

In a case where the switch signal is low level, FETs M20, M21, and M22 become "ON", and accordingly, FETs M16, M17, M24, and M25 are turned "ON". In such a case, FETs M18, M19 are in operation, and audio signals are output from the output terminal 32. On the other hand, in a case where the switch signal is high level, FETs M20, M21, and M22 become "OFF", and accordingly, FETs M16, M17, M24, and M25 are turned "OFF". Therefore, in such a case, FETs M18, M19 cease operation.

In the conventional circuit shown in FIG. 5, the differential circuit of FETs M1, M2 is subjected to positive feedback via FETs M1, M7, M6, and M5. Furthermore, the differential circuit of FETs M11, M12 is subjected to positive feedback via FETs M12, M17, M16, and M15. Therefore, when the switch signal is changed from low level to high level, the output of audio signals from the output terminal 32 cannot be stopped unless the loops of the positive feedback are disconnected.

Nevertheless, disconnection of the loops of the positive feedback cause change of the electric potential of the output terminal 32, and creates an abrupt change of electrical potential of electric source Vcc, or an abrupt ground potential. This raises a problem of the generation of shock noise.

SUMMARY OF THE INVENTION

It is a general object of the present invention to provide a circuit and a semiconductor device that substantially obviate one or more of the problems caused by the limitations and disadvantages of the related art.

Features and advantages of the present invention are set forth in the description which follows, and in part will become apparent from the description and the accompanying drawings, or may be learned by practice of the invention according to the teachings provided in the description. Objects as well as other features and advantages of the present invention will be realized and attained by a circuit and a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a circuit for a power amplifier which amplifies and outputs an audio signal by amplifying an input audio signal using first and second differential circuits, and driving a push-pull output transistor with the outputs from the first and second differential circuits, the circuit including: a signal generating part generating a disconnection timing signal for disconnecting a bias current reducing an activation current of each of the first and second differential circuits based on a switch control signal, and a positive feedback loop of each of the first and second differential circuits; a switch part being disposed in each of the positive feedback loops of the first and second differential circuits, and disconnecting the positive feedback loops in response to the disconnection timing signal; and a bias unit stopping the operation of the first and second differential circuits by reducing the activation currents of the first and second differential circuits, respectively, by reduction of the bias currents.

According to the circuit of an embodiment of the present invention, the signal generation unit may include: an integrator integrating the switch control signal so that a waveform of the signal is an inclined waveform; a variable bias circuit decreasing the bias current according to the inclined waveform; and a comparator generating the disconnection timing signal by comparing the inclined waveform with a reference electric potential.

According to the circuit of an embodiment of the present invention, the signal generation unit may further include: an inverse circuit reversing the inclined waveform; a second comparator generating a switch signal connecting the positive feedback loops of the first and second differential circuits by comparing the reversed inclined waveform with another reference electric potential, wherein the variable bias circuit outputs a first bias current which decreases, and a second bias current which increases according to the inclined waveform and the reversed inclined waveform, respectively.

Furthermore, the circuit according to an embodiment of the present invention is a semiconductor device.

Other objects and further features of the present invention will be apparent from the following detailed description when read in conjunction with the accompanying drawings.

DESCRIPTION OF THE PREFERRED EMBODIMENTS

In the following, embodiments of the present invention are described with reference to the accompanying drawings.

Figure 1:
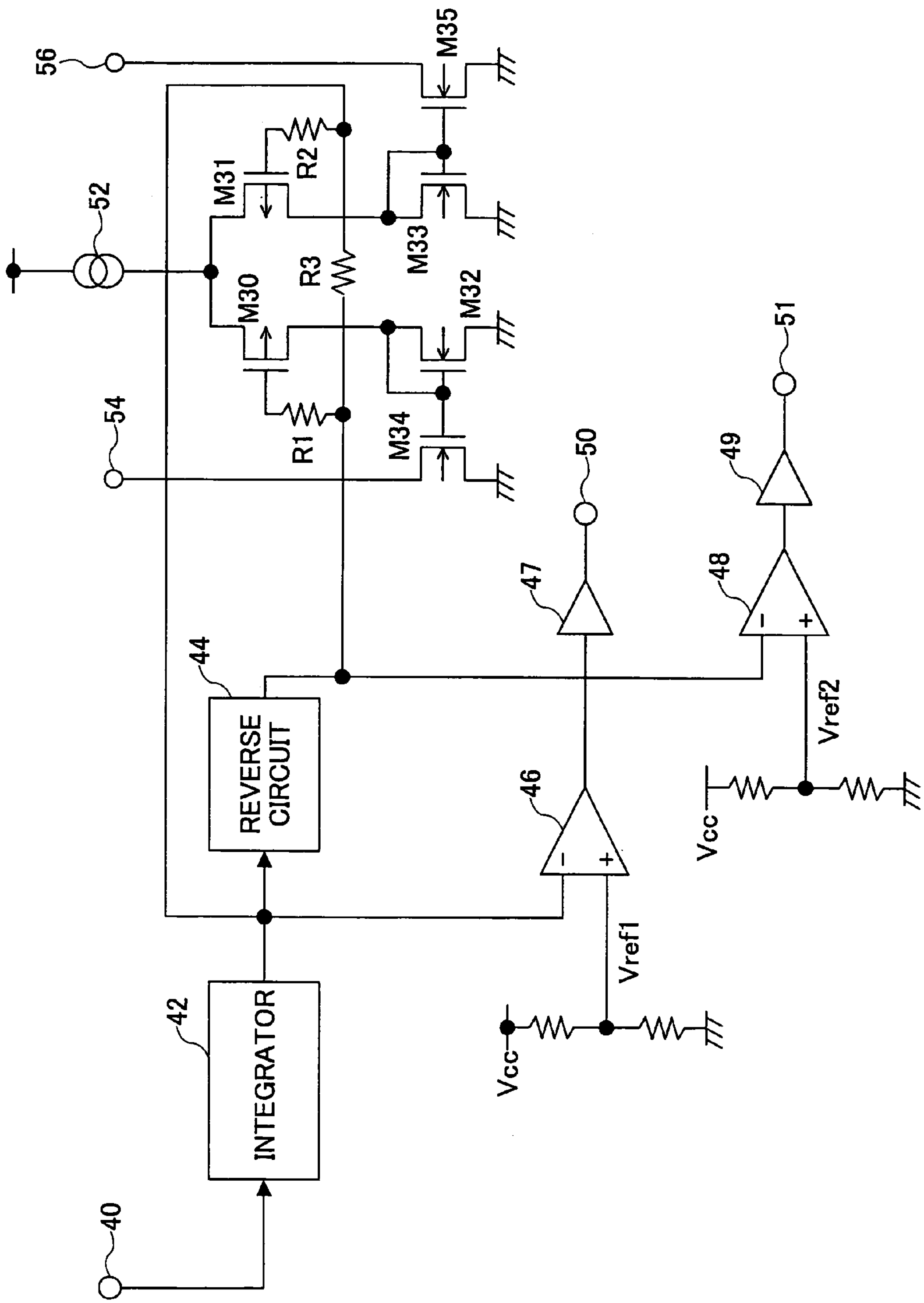
FIG. 1 is a circuit diagram of a shock noise reduction circuit according to an embodiment of the present invention.
Figures 2A, 2B, 2C, 2D, 2E, 2F:
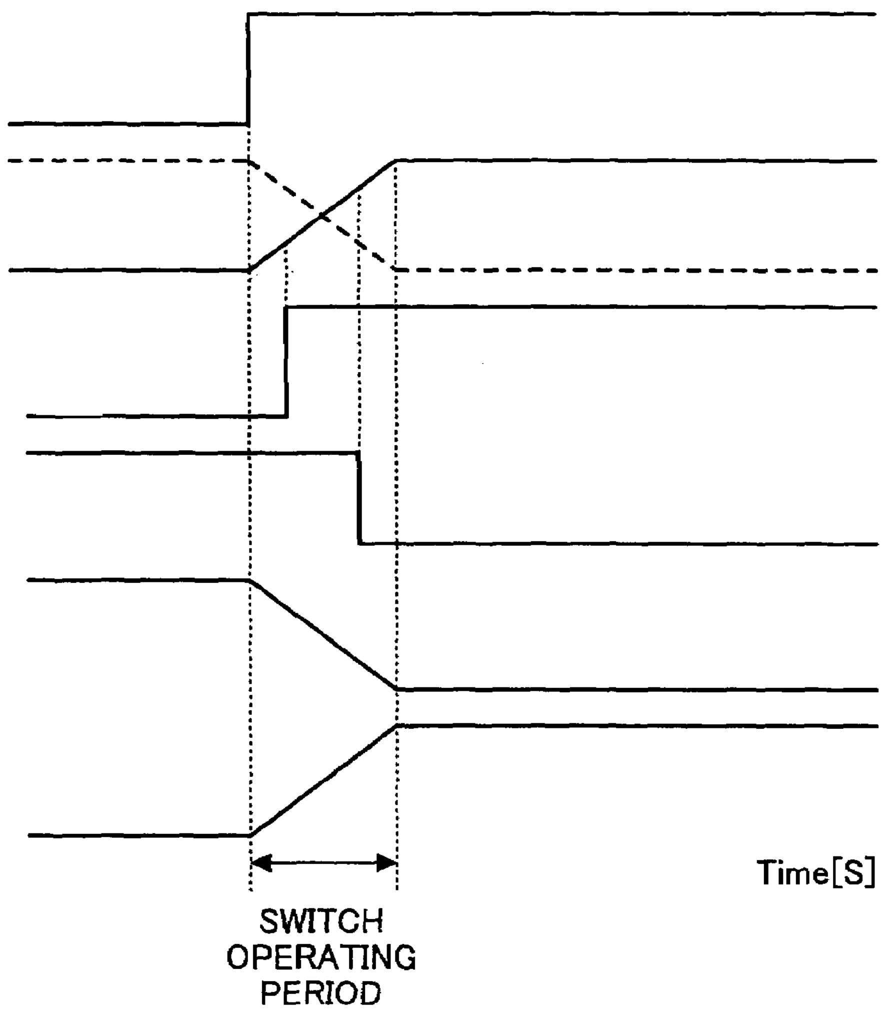
FIGS. 2A through 2F are diagrams showing a signal waveform of each portion of the circuit shown in FIG. 1.

FIG. 1 is a circuit diagram of a shock-noise reduction circuit according to an embodiment of the present invention. The circuit may be implemented as a semiconductor integrated device. In the drawing, a switch control signal is supplied to a terminal 40. The switch control signal is a binary signal as shown in FIG. 2A. The switch control signal, being integrated at an integrator 42 and having a waveform as illustrated with a solid line in FIG. 2B, is supplied to a reverse circuit 44, to a comparator 46, and further to one end of resistances R2, R3 of the differential circuit. The reverse circuit 44 reverses the output of the integrator 42, and supplies the reversed output, having a waveform as illustrated with a broken line in FIG. 2B, to a comparator 48, to one end of a resistance R1, and to the other end of the resistance R3.

Figure 4:
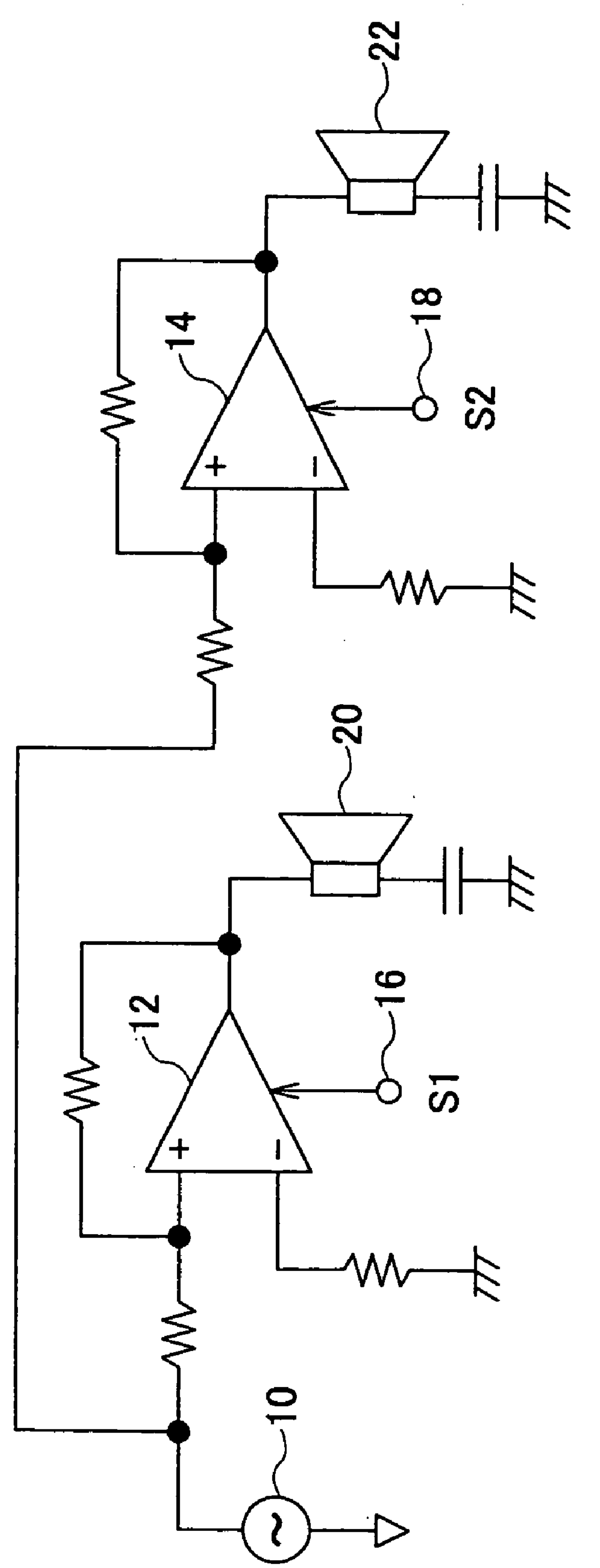
FIG. 4 is a block diagram of an audio power amplifier according to an embodiment of the present invention.
Figure 5:
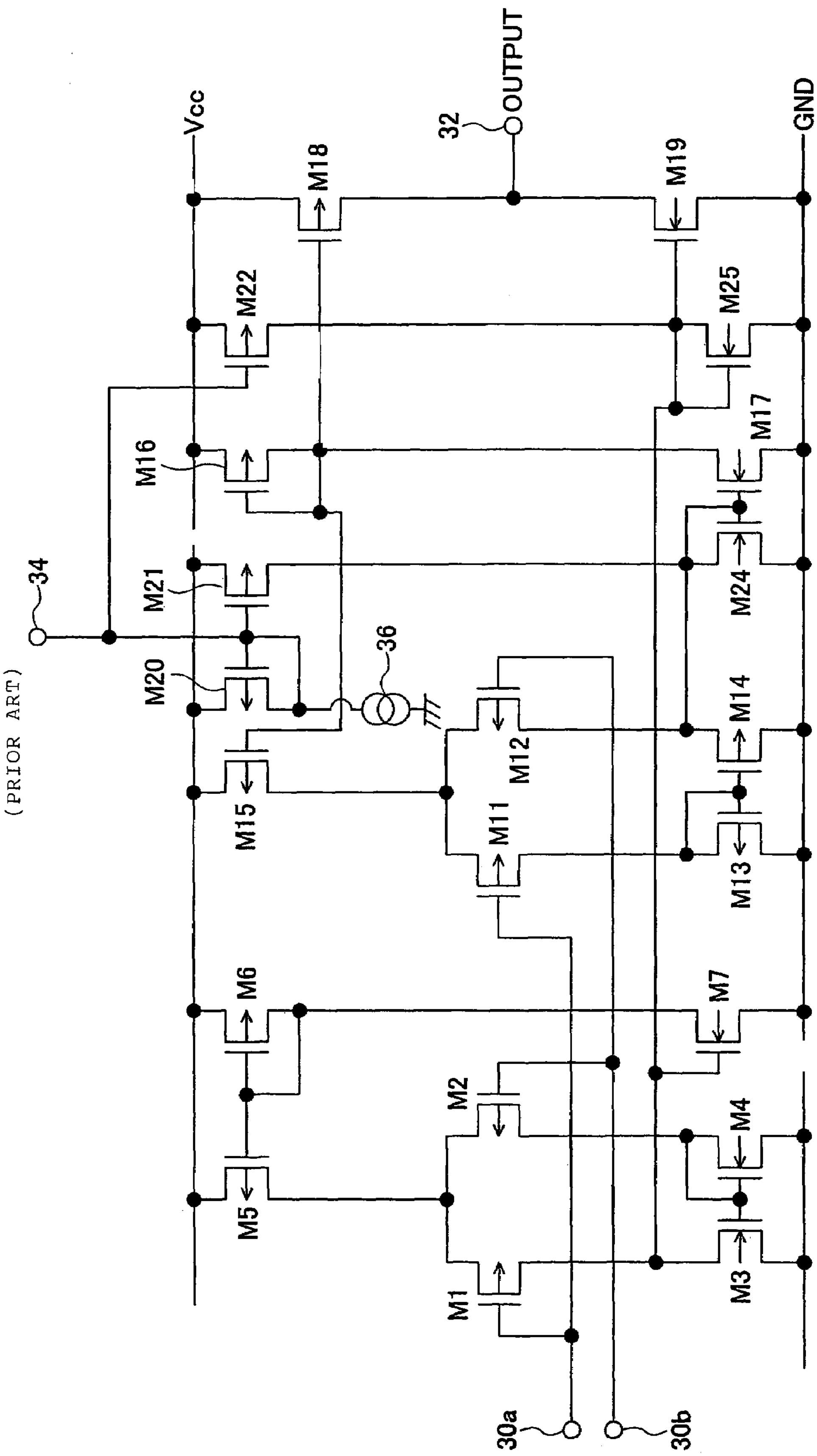
FIG. 5 is a circuit diagram of an output stage of a conventional power amplifier.

The comparator 46 compares the output of the integrator 42 with a reference potential Vref 1 and generates a disconnection timing signal as illustrated in FIG. 2D. The disconnection timing signal is output from a terminal 50 via a buffer 47 and is supplied to the power amplifier 12 shown in FIG. 4. The comparator 48 compares the output of the reverse circuit 44 with a reference potential Vref 2 and generates a disconnection timing signal as illustrated in FIG. 2C. The disconnection timing signal is output from a terminal (inverter) 51 via a buffer 49 and is supplied to the power amplifier 14 shown in FIG. 4.

The p channel FETs M30, M31 form a differential circuit together with a current generator 52 and the n channel FETs M32, M33. The gates of FETs M30, M31 are connected to the other ends of resistances R1, R2, respectively. The gate and drain of FET M32 are connected to the gate of n channel FET M34, and the sources of FETs M32 and M34 are connected (ground) to form a current mirror circuit. Thereby, a bias current for the power amplifier 14 (as shown in FIG. 2F) is output from the drain of FET M34 via a terminal 54.

The gate and drain of FET M33 are connected to the gate of n channel FET M35, and the sources of FETs M33 and M35 are connected (ground) to form a current mirror circuit. Thereby, a bias current for the power amplifier 12 (as shown in FIG. 2E) is output from the drain of FET M35 via a terminal 56.

Figure 3:
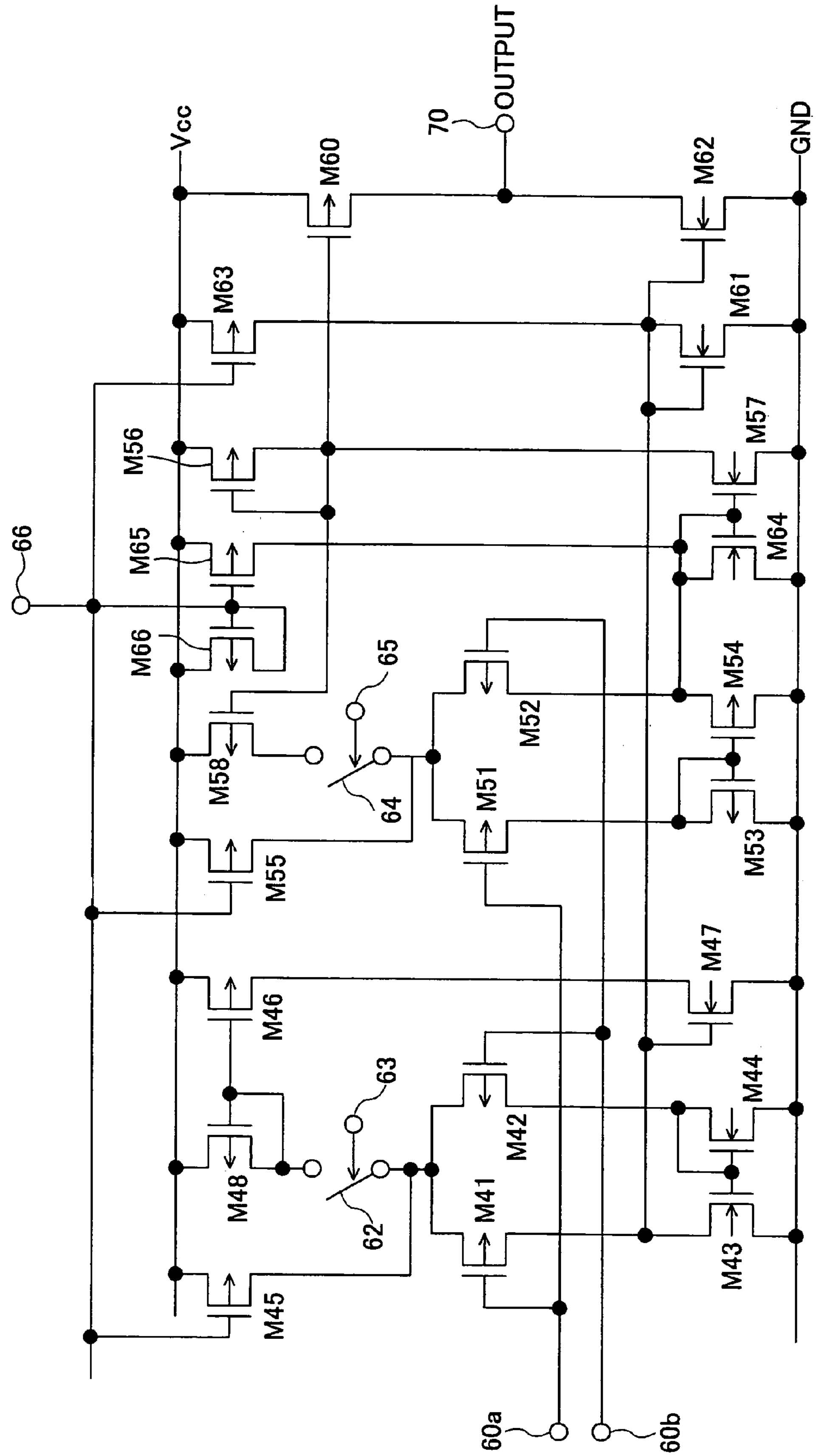
FIG. 3 is a circuit diagram of an output stage of a power amplifier provided with a shock noise reduction circuit according to an embodiment of the present invention.

FIG. 3 is a circuit diagram of an output stage of a power amplifier provided with a circuit (shock noise reduction circuit) according to an embodiment of the present invention. The circuit may be provided as a semiconductor integrated device. The circuit may be employed as, for example, the power amplifier 12 or 14. Here, the circuit is described to be used with power amplifier 12. In FIG. 3, audio signals are input between terminals 60*a* and 60*b* by differential input. The terminals 60*a*, 60*b* are connected to the gates of p channel FETs M41 and M42, respectively. The FETs M41, M42 form a differential circuit together with n channel FETs M43, M44, p channel FETs M45, M48, and a switch 62. The disconnection timing signal output from the terminal 51 shown in FIG. 1 is supplied from a terminal 63 to the switch 62. The switch 62 is turned ON when the disconnection timing signal is a low level, and is turned OFF when the disconnection timing signal is a high level. The source of FET M45 is connected to electric source Vcc, and the gate of FET M45 is connected to a terminal 66 from which a bias signal is supplied.

A gate and a drain of FET M48 are connected to a gate of FET M46, thereby forming a current mirror circuit. A drain of FET M46 is connected to a drain of n channel FET M47, and the gate of FET M47 is connected to the drain of FET M41. Thereby, when the switch 62 is ON, the output of the differential circuit of FETs M41, M42 is positively fed back to the differential circuit of FETs M41, M42 via FETs M41, M47, M46, M48, and the switch 62. It is to be noted that the mirror ratio between FETs M48 and M46 is, for example, 4 to 1.

The gates of p channel FETs M51 and M52 are connected to terminals 60*a*, 60*b*, respectively. The FETs M51 and M52 form a differential circuit together with n channel FETs M53, M54, p channel FETs M55, M58, and a switch 64. The disconnection timing signal output from the terminal 51 shown in FIG. 1 is supplied from a terminal 65 to the switch 64. The switch 64 is turned ON when the disconnection timing signal is a low level, and is turned OFF when the disconnection timing signal is a high level. The source of FET M55 is connected to electric source Vcc, and the gate of FET M55 is connected to the terminal 66 from which a bias signal is supplied.

The gate of FET M58 is connected to the gate and drain of FET M56 and to the gate of p channel FET M60 used for output, and the sources of FETs M56, M58, and M60 are connected to the power source Vcc, thereby forming a current mirror circuit. The drain of FET M56 is connected to the drain of n channel FET M57, and the gate of FET M57 is connected to the drain of FET M52. Thereby, when the switch 64 is ON, the output of the differential circuit of FETs M51, M52 is positively fed back to the differential circuit of FETs M51, M52 via FETs M52, M57, M56, M58, and the switch 64. It is to be noted that the mirror ratio between FETs M58 and M56 is, for example, 2 to 1.

The gate of FET M47 is connected to the gate and drain of n channel FET M61 and the gate of n channel FET M62 used for output, and the sources of FETs M47, M61, and M62 are grounded, thereby forming a current mirror circuit. The FETs M60, M62 used for output have a common drain to which an output terminal 70 is connected, to thereby form a single end push-pull structure. Accordingly, audio. signals are output from the output terminal 70.

When the switch signal changes from low level to high level, the disconnection timing signal, as shown in FIG. 2C, becomes a high level to thereby turn the switches 62, 64 to an OFF state. Subsequently, the positive feed back is disconnected. Then, the bias current for the power amplifier 12, as shown in FIG. 2E, gradually decreases, and eventually, the operation of the differential circuits formed by the FETs M41, M42 and FETs M51, M52, respectively, cease. Accordingly, the electric potential of the-output terminal 70 gradually becomes an electric potential of the electric source Vcc or earth electric potential. Therefore, generation of shock noise occurring during the switching of the power amplifier can be restrained.

In consequence, the circuit according to an embodiment of the present invention includes a circuit for a power amplifier which amplifies and outputs an audio signal by amplifying an input audio signal using first and second differential circuits, and driving a push-pull output transistor with the outputs from the first and second differential circuits. The circuit includes: a signal generating part generating a disconnection timing signal for disconnecting a bias current reducing an activation current of each of the first and second differential circuits based on a switch control signal, and a positive feedback loop of each of the first and second differential circuits; a switch part being disposed in the positive feedback loops each of the first and second differential circuits, and disconnecting the positive feedback loops in response to the disconnection timing signal.; and a bias unit stopping the operation of the first and second differential circuits by reducing the activation currents of the first and second differential circuits, respectively, by reduction of the bias currents. Accordingly, the shock noise generated during switching of a power amplifier can be reduced.

According to the circuit of an embodiment of the present invention, the signal generation unit may include an integrator integrating the switch control signal so that a waveform of the signal is inclined, a variable bias circuit decreasing the bias current according to the inclined waveform, and a comparator generating the disconnection timing signal by comparing the inclined waveform with a reference electric potential. Accordingly, the circuit of an embodiment of the present invention can be satisfactorily executed.

According to the circuit of an embodiment of the present invention, the signal generation unit may further include an inverse circuit reversing the inclined waveform, a second comparator generating a switch signal connecting the positive feedback loop of the first and second differential circuits by comparing the reversed inclined waveform with another reference electric potential, wherein the variable bias circuit outputs a first bias current which decreases, and a second bias current which increases according to the inclined waveform and the reversed inclined waveform, respectively. Accordingly, the switching between two power amplifiers can be satisfactorily controlled.

The circuit according to an embodiment of the present invention may be a semiconductor device.

Further, the present invention is not limited to these embodiments, but various variations and modifications may be made without departing from the scope of the present invention.

The present application is based on Japanese Priority Application No. 2003-176429 filed on Jun. 20, 2003, with the Japanese Patent Office, the entire contents of which are hereby incorporated by reference.

What is claimed is:

1. A circuit for a power amplifier which amplifies and outputs an audio signal by amplifying an input audio signal using first and second differential circuits, and driving a push-pull output transistor with the outputs from the first and second differential circuits, the circuit comprising:

a signal generating part generating a disconnection timing signal for disconnecting a bias current reducing an activation current of each of the first and second differential circuits based on a switch control signal, and a positive feedback loop in each of the first and second differential circuits;

a switch part being disposed in the positive feedback loops of each of the first and second differential circuits, and disconnecting the positive feedback loops in response to the disconnection timing signal; and a bias part stopping the operation of the first and second differential circuits by reducing the activation currents of the first and second differential circuits, respectively, by reduction of the bias currents.

2. The circuit as claimed in claim 1, wherein the signal generating part comprises:

an integrator integrating the switch control signal so that a waveform of the signal is inclined;

a variable bias circuit decreasing the bias current according to the inclined waveform; and a comparator generating the disconnection timing signal by comparing the inclined waveform with a reference electric potential.

3. The circuit as claimed in claim 2, wherein the signal generating part further comprises:

an inverse circuit reversing the inclined waveform; and a second comparator, connecting to the positive feedback loops of the first and second differential circuits, generating a switch signal by comparing the reversed inclined waveform with another reference electric potential;

wherein the variable bias circuit outputs a first bias current which decreases, and a second bias current which increases according to the inclined waveform and the reversed inclined waveform, respectively.

4. The circuit as claimed in claim 1, wherein the circuit is a semiconductor device.

5. The circuit as claimed in claim 2, wherein the circuit is a semiconductor device.

6. The circuit as claimed in claim 3, wherein the circuit is a semiconductor device.

* * * * *